United States Patent [19]

Seiler et al.

[11] 4,019,645
[45] Apr. 26, 1977

[54] CRUCIBLE OF FUSED VITREOUS SILICA

[75] Inventors: Karl Seiler, Hanau; Martin Selke, Mittelbuchen; Oswald Siegling, Klein-Auheim; Heinz Herzog, Dettingen; Horst Albrecht, Hanau; Heinrich Mohn, Hailer, all of Germany

[73] Assignee: Heraeus-Schott Quarzschmelze GmbH, Hanau am Main, Germany

[22] Filed: Dec. 3, 1973

[21] Appl. No.: 420,824

[30] Foreign Application Priority Data

Dec. 4, 1972 Germany .............. 2259353

[52] U.S. Cl. ............... 215/1 R; 65/42; 65/54; 65/55; 23/273 SP
[51] Int. Cl.² ............. C03B 23/20; B65D 23/00; B01D 1/00
[58] Field of Search ............ 65/112, 113, 42, 54, 65/55, 36, 42; 23/273 SP; 215/1 R

[56] References Cited

UNITED STATES PATENTS

| | | | |
|---|---|---|---|
| 1,624,699 | 4/1927 | Wayringer | 215/1 R |
| 2,565,061 | 8/1951 | Bednarz | 65/55 X |
| 2,822,646 | 2/1958 | Kreftt | 65/42 |
| 3,203,779 | 8/1965 | Reber | 65/112 X |
| 3,215,517 | 11/1965 | Zimmermann | 65/113 |
| 3,694,165 | 9/1972 | Kramer | 23/273 SP |
| 3,716,345 | 2/1973 | Grabmaier | 23/273 SP |
| 3,795,488 | 3/1974 | Oliver | 23/273 SP |

FOREIGN PATENTS OR APPLICATIONS

| | | |
|---|---|---|
| 722,174 | 7/1942 | Germany |
| 500,938 | 6/1930 | Germany |

*Primary Examiner*—S. Leon Bashore
*Assistant Examiner*—F. W. Miga
*Attorney, Agent, or Firm*—Burgess, Dinklage & Sprung

[57] ABSTRACT

A crucible of pure transparent silica glass or pure translucent or opaque silica glass for the production of monocrystals used in making semiconductor elements which includes a hollow cylindrical part and a welded-on head. The head end of the hollow cylindrical part is formed from a tube with a head margin portion constricted towards the tube axis which is formed by shaping one end of the tube. A plate is welded into the aperture formed by the constricted head margin portion and has an area equal to at least one-tenth and at most four-fifths of the total head area made up by the head margin portion and the head.

5 Claims, 3 Drawing Figures

CRUCIBLE OF FUSED VITREOUS SILICA

BACKGROUND

The invention relates to a crucible of pure silica glass (transparent, translucent, or opaque fused, vitreous silica) and to a method of making same, especially for use in the production of monocrystals used in making semiconductor elements.

German Pat. No. 962,868 discloses crucibles for the production of monocrystals by the Czochralski method. These monocrystals are used in making semiconductor elements. The crucibles consist of quartz (transparent fused silica made from rock crystal) and are provided on their interior with a coating of pure silicon dioxide obtained by the rectification of silicon tetrachloride followed by hydrolysis. These crucibles have proven practical, but the making of such a crucible requires a reat expenditure of force and energy.

Crucibles of pure silica glass for use in making monocrystals, especially silicon monocrystals for the semiconductor art, have hitherto been made by heating one end of a pure silica glass tube and, while the glass is in the plastic state, forming the head of the crucible from the marginal portions. The crucible is given its precise shape by blowing it in a graphite mold. This process has the disadvantage that, in the case of crucibles of relatively large diameter very much energy is required in order to form the head of the crucible from the wall of the tube. Since the tube circumference increases linearly with the diameter but its end area increases as the square thereof, the prior art process becomes all the more uneconomical as the diameter of the crucible increases.

SUMMARY

It is the object of the invention to create a crucible of pure silica glass (transparent, translucent or opaque viterous fused silica), especially for use in the production of monocrystals, which will have approximately equally good characteristics, but whose manufacture will require substantially less expenditure of force and energy than the method of the prior art.

This object is achieved in accordance with the invention by welding a plate of pure silica glass into the constricted marginal portion of the head end. The construction of the crucible in accordance with the invention makes it possible for a plate of pure transparent silica glass or of pure translucent or opaque silica glass to be welded into a crucible. In like manner, a plate of either pure transparent silica glass or pure translucent or opaque silica glass can be welded into a crucible of pure transparent or opaque silica glass. Crucibles with a flat plate welded into them have proven practical. However, domed plates may also be used, namely those in which the dome, as seen in the direction of the outside surface of the crucible head, is convex. In particular, the area of the inserted plate ranges from one-tenth to four-fifths of the total head area of the crucible. With head surface areas such as these, the reduction in the amount of force required and the saving of energy in the making of the crucible are especially advantageous.

DESCRIPTION OF THE DRAWING

Examples of crucibles constructed in accordance with the invention are represented in longitudinal cross-section in FIGS. 1a and 1b.

With the aid of FIG. 2 a method of making crucibles in accordance with the invention is described.

DESCRIPTION

There are two forms of pure vitreous silica: transparent fused silica and translucent or opaque fused silica. The latter contains a large number of microscopic bubbles which create a milky appearance caused by the scattering of light.

Figure 1A:
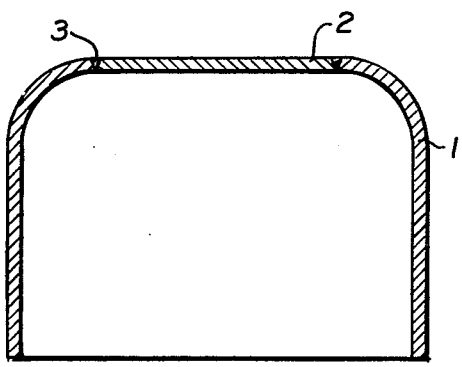
Figure 1B:
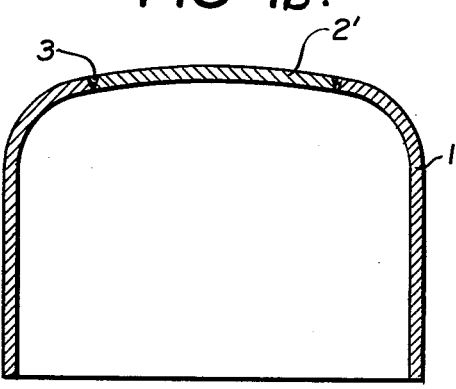

The crucibles represented in the longitudinal cross-section in FIGS. 1a and 1b consist of a tubular portion 1 of pure silica glass having constricted marginal portions 4 (FIG. 2) at the head end. Into the aperture defined by the constricted marginal portions there is welded at the seam 3, a flat plate 2 in FIG. 1a, and a domed plate 2' instead of the flat plate 2 in FIG. 1b. Plate 2' in FIG. 1b is domed such that, as seen from the top in the drawing, the doming is convex. If pure transparent silica glass is used as the crucible material, plate 2 may consist of either pure transparent silica glass or pure translucent or opaque silica glass; if pure translucent or opaque silica glass is used as the crucible material, plate 2 may consist of either pure transparent silica glass or pure translucent or opaque silica glass. However, a coated pure silica glass may also be used as crucible material as in the prior art. If the crucible material consists of pure silica glass made from rock crystal, it is recommended that the crucible have an internal coating of high-purity quartz glass obtained by a synthetic method. In this case, plate 2 will consist only of high purity synthetic vitreous silica. If pure translucent or opaque silica glass is used as crucible material, its internal surface may be covered with a layer of pure transparent silica glass. Plate 2 will then consist of pure transparent silica glass that has been made from granulated rock crystal.

The making of a crucible in accordance with the invention will now be described with the aid of FIG. 2. The starting material is, for example, a pure silica glass tube 1 whose diameter is the same as that of the crucible being made. This pure silica glass tube 1 is heated on a certain width around its circumference by means of a heat source such as burner 5, until it becomes plastic. While in the plastic state, the tube 1 is squeezed in the heated area to form constricted marginal areas 4 and then severed. Into the aperture which is left and which is defined by the marginal areas, either a flat plate 2 or a domed plate 2' is welded at the seam 3. The flat plate 2 is made, for example, by slicing from a cylinder. If necessary the edges of the constricted marginal portions 4 are ground before welding plate 2 in place.

Figure 2:
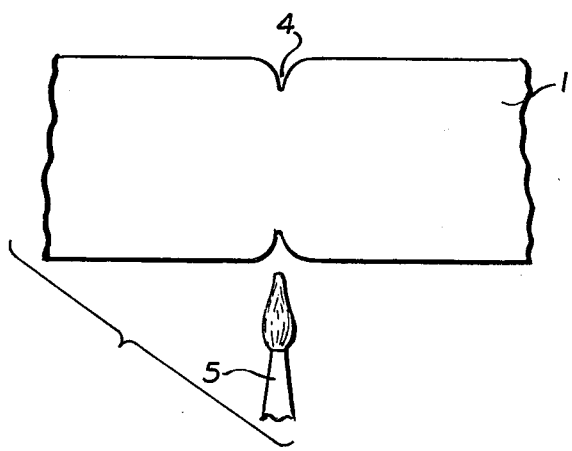

As shown by FIG. 2, the manufacturing method described enables two crucibles to be made simultaneously from tube 1, whereas with the known method only one crucible could be obtained at a time, and this serves to show the advantage of the present invention.

Other advantages of the method of making crucibles in accordance with the invention are the substantially lower energy costs. Furthermore, the consumption of material is substantially lower than in the conventional method. Since the crucible consists of two parts, these parts may be inspected and tested before welding them together, thereby preventing the discarding of whole crucibles for defects. Furthermore, it is possible in this manner to provide the crucible quite easily with a very flat bottom, which is important towards the achievement of the most uniform possible thickness of the monocrystal all the way through to the end of the pulling process.

We claim:

1. In a silica containing crucible for making monocrystals having a generally hollow cylindrical portion forming the sides thereof and a bottom portion, the improvement wherein said hollow cylindrical portion has a lower concave terminal end portion about its circumference which is directed inwardly toward the center of said crucible and terminates short of the center of said crucible, said bottom portion joined to said terminal end portion, the junction of said bottom portion and said terminal end portion having a weld seam, said bottom portion having an area equal to at least one-tenth and at most four-fifths of the total area of said terminal end portion and said bottom portion.

2. Crucible of claim 1 wherein the bottom portion is flat.

3. Crucible of claim 1 wherein the bottom portion is domed and, as seen in the direction of the outer surface of the crucible head, is convex.

4. Crucible of claim 1 wherein the terminal end portion of the constricted head margin portion is ground.

5. Crucible of claim 1 wherein the cylindrical portion consists of pure transparent silica glass and the bottom portion of pure translucent or opaque silica glass, or the cylindrical portion consists of pure translucent or opaque silica glass and the bottom portion of pure transparent silica glass.

* * * * *

UNITED STATES PATENT AND TRADEMARK OFFICE
CERTIFICATE OF CORRECTION

PATENT NO. : 4,019,645
DATED : April 26, 1977
INVENTOR(S) : Karl Seiler et al

It is certified that error appears in the above-identified patent and that said Letters Patent are hereby corrected as shown below:

Column 1, line 19, "reat" should read -- great --.

Signed and Sealed this twelfth Day of July 1977

[SEAL]

Attest:

RUTH C. MASON
*Attesting Officer*

C. MARSHALL DANN
*Commissioner of Patents and Trademarks*